(12) United States Patent  
Watanabe et al.

(10) Patent No.: US 7,498,716 B2
(45) Date of Patent: Mar. 3, 2009

(54) PIEZOELECTRIC ACTUATOR, INSPECTION METHOD, AND LIQUID EJECT APPARATUS

(75) Inventors: Hidetoshi Watanabe, Tokoname (JP); Toshihumi Kubo, Kirishima (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 11/564,967

(22) Filed: Nov. 30, 2006

(65) Prior Publication Data

US 2007/0200463 A1 Aug. 30, 2007

(30) Foreign Application Priority Data

Nov. 30, 2005 (JP) .............................. 2005-345087

(51) Int. Cl.
*H01L 41/08* (2006.01)
(52) U.S. Cl. .................... 310/317; 310/318; 310/366
(58) Field of Classification Search .................. 310/317, 310/318, 328, 366

See application file for complete search history.

(56) References Cited

U.S. PATENT DOCUMENTS

| | | | |
|---|---|---|---|
| 5,794,080 A | * | 8/1998 | Watanabe et al. ............. 396/53 |
| 7,044,587 B2 | | 5/2006 | Yuu et al. |
| 7,305,178 B2 | * | 12/2007 | Haubold et al. ............. 392/447 |
| 2003/0132418 A1 | | 7/2003 | Kwon et al. |
| 2004/0113995 A1 | * | 6/2004 | Yuu et al. ..................... 347/68 |
| 2004/0129917 A1 | | 7/2004 | Kobota et al. |

FOREIGN PATENT DOCUMENTS

| | | |
|---|---|---|
| EP | 1560279 A2 | 8/2005 |
| JP | 2004165650 | 6/2004 |

\* cited by examiner

*Primary Examiner*—Thomas M Dougherty
(74) *Attorney, Agent, or Firm*—Baker Botts LLP

(57) ABSTRACT

A piezoelectric actuator includes a piezoelectric vibrating plate including piezoelectric ceramics, an internal electrode formed on a first surface of the piezoelectric vibrating plate, a piezoelectric layer formed on the internal electrode, and a plurality of surface electrodes that are provided on a surface of the piezoelectric layer. When the internal electrode is grounded and a predetermined voltage is applied to a liquid contacting with a second surface of the piezoelectric vibrating plate, a value of a current flowing between the liquid and the internal electrode is not more than 0.01 μA.

10 Claims, 2 Drawing Sheets

US 7,498,716 B2
1

PIEZOELECTRIC ACTUATOR, INSPECTION METHOD, AND LIQUID EJECT APPARATUS

CROSS-REFERENCE TO RELATED APPLICATION

This application claims priority from Japanese Patent Application No. 2005-345087, filed on Nov. 30, 2005, the entire subject matter of which is incorporated herein by reference.

TECHNICAL FIELD

Aspects of the present invention relate to a piezoelectric actuator, an inspection method of the same, and a liquid eject apparatus using the same. Specifically, the piezoelectric actuator may be used for a fuel injector, an ink jet printer, or the like. The piezoelectric actuator may also be used for a liquid eject apparatus, such as a printing head that utilized spread vibration, stretch vibration or thickness vibration.

BACKGROUND

Products using piezoelectric ceramics include, for example, a piezoelectric actuator, a filter, a piezoelectric resonator (including an oscillator), an ultrasonic vibrator, an ultrasonic motor, a piezoelectric sensor, and the like. Amongst these products, the piezoelectric actuator has a response speed to an electrical signal of as fast as $10^{-6}$ seconds. The piezoelectric actuator is used to position an XY stage of a semiconductor manufacturing apparatus or for a printing head (liquid eject apparatus) of an ink jet printer. Recently, with high speed and low cost being required for a color printer, the demand for an ink eject piezoelectric actuator of an ink jet printer or the like has been increased.

JP-A-2004-165650 discloses a piezoelectric actuator that has a plurality of displacement elements each having a piezoelectric ceramic layer (piezoelectric layer) and a pair of electrodes with the piezoelectric layer interposed therebetween. The piezoelectric layer is disposed on a surface of a ceramic substrate. A piezoelectric vibrating plate formed of a piezoelectric material (piezoelectric ceramics) is used as the ceramic substrate, and the piezoelectric actuator is used for a printing head (liquid eject apparatus).

FIG. 5 is a schematic cross-sectional view showing a known liquid eject apparatus having a piezoelectric actuator disclosed in JP-A-2004-165650. As shown in FIG. 5, the liquid eject apparatus 70 has a plurality of liquid flow passages 53a arranged in parallel. The liquid eject apparatus 70 also has a piezoelectric actuator 61 provided on a flow passage member 53 which forms partition walls 53b serving as walls partitioning the individual liquid flow passages 53a.

The piezoelectric actuator 61 has a plurality of displacement elements 67 provided on a surface of a piezoelectric vibrating plate 62. Each of the displacement elements 67 has a piezoelectric layer 65 and a pair of electrodes (an internal electrode 64 and a surface electrode 66) with the piezoelectric layer 65 interposed therebetween. The piezoelectric actuator 61 is mounted on the flow passage member 53 such that the positions of the liquid flow passage 53a and the surface electrode 66 are aligned with each other.

A common liquid supply flow passage (not shown), which is provided in the flow passage member 53, is connected to each of the liquid flow passages 53a. The liquid from the outside is supplied to and filled into each of the liquid flow passages 53a from the liquid supply flow passage. If the liquid is ejected, the ejected liquid flows into each of the flow pas-

2 sages 53a through the supply flow passage. For this reason, the rear surface of the piezoelectric vibrating plate 62, which is located above each of the liquid flow passages 53a, is brought into contact with the liquid flowing in the liquid flow passage 53a.

The liquid eject apparatus 70 displaces a displacement element 67 by applying the driving voltage between the surface electrode 66 and the internal electrode 64 so as to change a volume of the liquid flow passage 53a. Accordingly, the liquid in the flow passage 53a is pressurized and the liquid is ejected from the liquid eject port 58 that is opened at the bottom of the flow passage member 53.

However, if a predetermined driving voltage is repeatedly applied for a long time in a state where the piezoelectric vibrating plate 62 is brought into contact with the liquid, the internal electrode 64 and the piezoelectric vibrating plate 62 are separated from each other. Thus, driving durability is lowered. This problem drastically appears in a piezoelectric actuator having a thickness of not more than 100 µm.

SUMMARY

Aspects of the invention provide a piezoelectric actuator having excellent driving durability.

Also, aspects of the invention provide an inspection method that can determine that a piezoelectric actuator has excellent driving durability.

Further, aspects of the invention provide a liquid eject apparatus having excellent driving durability.

The present inventors have found that, when an internal electrode serves as a ground electrode, a rear surface of a piezoelectric vibrating plate formed of piezoelectric ceramics is brought into contact with a liquid, and a predetermined voltage is applied to the liquid, if a value of a current flowing between the liquid and the ground electrode is not more than a specific value, the internal electrode and the piezoelectric vibrating plate are suppressed from being separated from each other. Accordingly, a piezoelectric actuator having excellent driving durability can be obtained.

That is, a piezoelectric actuator according to an aspect of the invention comprises: a piezoelectric vibrating plate including piezoelectric ceramics; an internal electrode formed on a first surface of the piezoelectric vibrating plate; a piezoelectric layer formed on the internal electrode; and a plurality of surface electrodes that are provided on a surface of the piezoelectric layer, wherein when the internal electrode is grounded and a predetermined voltage is applied to a liquid contacting with a second surface of the piezoelectric vibrating plate, a value of a current flowing between the liquid and the internal electrode is not more than 0.01 µA.

According to another aspect of the invention, there is provided an inspection method of a piezoelectric actuator, the piezoelectric actuator including a piezoelectric vibrating plate including piezoelectric ceramics, an internal electrode formed on a first surface of the piezoelectric vibrating plate, a piezoelectric layer formed on the internal electrode, and a plurality of surface electrodes that are provided on a surface of the piezoelectric layer, the method comprising: preparing the piezoelectric actuator; grounding the internal electrode and contacting a liquid with a second surface of the piezoelectric vibrating plate; applying a predetermined voltage to the liquid; and measuring a value of a current flowing between the liquid and the internal electrode.

According to another aspect of the invention, a liquid eject apparatus comprises: a piezoelectric actuator including: a piezoelectric vibrating plate including piezoelectric ceramics, an internal electrode formed on a first surface of the piezoelectric vibrating plate, a piezoelectric layer formed on the internal electrode, and a plurality of surface electrodes that are provided on a surface of the piezoelectric layer, wherein when the internal electrode is grounded and a predetermined voltage is applied to a liquid contacting with a second surface of the piezoelectric vibrating plate, a value of a current flowing between the liquid and the internal electrode is not more than 0.01 μA, wherein the piezoelectric actuator is mounted on a flow passage member having arranged therein a plurality of liquid flow passages each having a liquid eject port such that the second surface of the piezoelectric vibrating plate is brought into contact with the liquid flowing in each of the liquid flow passages, and wherein a volume of each of the liquid flow passages is changed by applying a driving voltage to each of the surface electrodes of the piezoelectric actuator such that the liquid flowing in each of the liquid flow passages is ejected from the liquid eject port.

DETAILED DESCRIPTION

<Piezoelectric Actuator>

Figure 1:
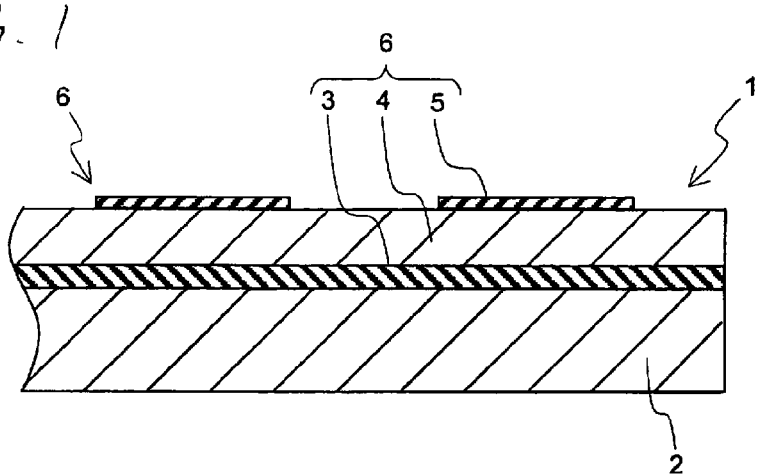
FIG. 1 is a schematic cross-sectional view showing a piezoelectric actuator according to an aspect of the invention.
Figure 2:
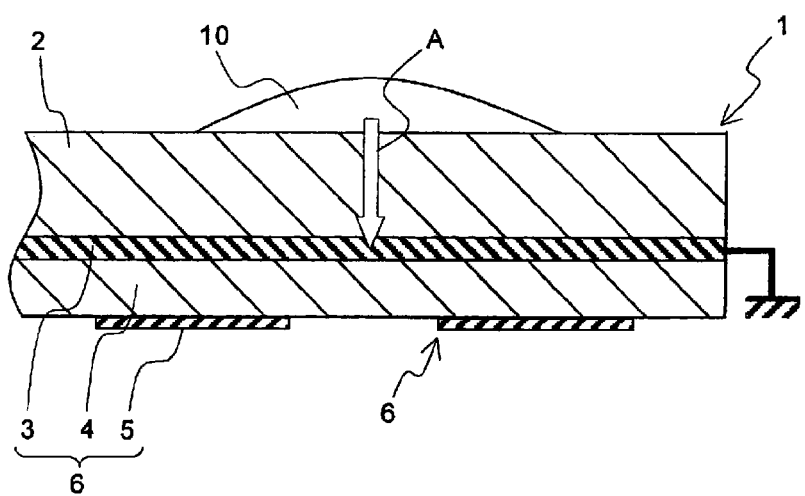
FIG. 2 is a schematic explanatory view illustrating a value of a current flowing between a liquid and a ground electrode.

A piezoelectric actuator according to an aspect of the invention will now be described with reference to the drawings. FIG. 1 is a schematic cross-sectional view showing a piezoelectric actuator. FIG. 2 is a schematic explanatory view illustrating a value of a current flowing between a liquid and a ground electrode.

As shown in FIG. 1, a piezoelectric actuator 1 has a piezoelectric vibrating plate 2, an internal electrode 3, a piezoelectric layer 4, and a surface electrode 5. The internal electrode 3, the piezoelectric layer 4 and the surface electrode 5 are laminated on a surface of the piezoelectric vibrating plate 2 in this order. The piezoelectric vibrating plate 2 and the piezoelectric layer 4 are formed of sheet members and have substantially the same shape and size.

The internal electrode 3 and the surface electrode 5 form electrodes of the piezoelectric actuator 1. A plurality of surface electrodes 5 are formed on a surface of the piezoelectric layer 4. Accordingly, a plurality of displacement elements 6, each having the internal electrode 3, the surface electrode 5 and the piezoelectric layer 4 interposed therebetween, are arranged on a surface of the piezoelectric vibrating plate 2.

A polarization method required for displacement of the piezoelectric actuator 1 (the displacement element 6) is not particularly limited. What is necessary is that polarization corresponding to a required displacement pattern is performed. When the piezoelectric actuator 1 is a unimorph actuator described below, it is preferable that at least a portion of the piezoelectric layer 4 interposed between the internal electrode 3 and the surface electrode 5 be polarized in a lamination direction.

If an external wiring board is connected to the surface electrode 5 and a voltage is applied between the electrodes (the surface electrode 5 and the internal electrode 3), the portion of the piezoelectric layer 4 interposed between the surface electrode 5 and the internal electrode 3 applied with the voltage is displaced. Specifically, if a driving voltage is applied to the surface electrode 5, displacement in a plane direction (a direction orthogonal to the lamination direction) is controlled by the piezoelectric vibrating plate 2, and the displacement element 6 is bent in the lamination direction. Accordingly, the piezoelectric actuator 1 operates as the unimorph actuator.

The thickness of the piezoelectric actuator 1 is not particularly limited, but is preferably not more than 100 μm, more preferably not more than 80 μm, still more preferably not more than 65 μm, and still more preferably not more than 50 μm. Accordingly, a large displacement can be obtained, and low-voltage and high-efficiency driving can be realized.

As described above, if a predetermined driving voltage is repeatedly applied in a state where the piezoelectric vibrating plate is brought into contact with the liquid, the internal electrode and the piezoelectric vibrating plate are separated from each other. Thus, driving durability is lowered. This problem drastically appears in a piezoelectric actuator having a thickness of 100 μm. However, since the separation can be suppressed in the present invention, the thickness of the piezoelectric actuator 1 can be set to 100 μm. Accordingly, a large displacement can be obtained.

In order to secure sufficient mechanical strength and to prevent damage during handling and operation, a lower limit of the thickness of the piezoelectric actuator 1 may be preferably 3 μm, more preferably 5 μm, still more preferably 10 μm, and still more preferably 20 μm.

In the piezoelectric actuator 1, as shown in FIG. 2, when the internal electrode 3 serves as a ground electrode, the rear surface of the piezoelectric vibrating plate 2 is brought into contact with the liquid 10. A voltage of 0.5 to 60 V is applied to the liquid 10, and a value of a current flowing between the liquid 10 and the ground electrode is not more than 0.01 μA. Accordingly, the internal electrode 3 and the piezoelectric vibrating plate 2 can be suppressed from being separated from each other when a predetermined driving voltage is repeatedly applied in a state where the piezoelectric vibrating plate 2 is brought into contact with the liquid.

The voltage is a voltage corresponding to a driving voltage for displacing the displacement element 6, and the predetermined driving voltage to be repeatedly applied refers to the voltage of 0.5 to 60 V. If a voltage in this range is applied to the surface electrode 5, the displacement element 6 can be displaced with a predetermined displacement. In contrast, if the voltage is smaller than 0.5 V, the displacement may be small. If the voltage exceeds 60 V, an excessive voltage is applied and the value of the current may exceed 0.01 μA. If the value of the current exceeds 0.01 μA and the predetermined driving voltage is repeatedly applied in the above-described state, the internal electrode 3 and the piezoelectric vibrating plate 2 are separated from each other. The value of the current is obtained though measurement using a current measurement apparatus such as, for example, "High Resistance Meter" manufactured by Agilent Technology Inc. described below.

An insulation resistance value between the liquid 10 and the ground electrode may be not less than 100 MΩ, preferably not less than 1000 MΩ, and more preferably not less than 4000 MΩ. Accordingly, when the voltage is applied to the liquid 10, the value of the current becomes not more than a predetermined value. In contrast, if the insulation resistance value is smaller than 100 MΩ, an undesirable occurs since the value of the current may exceed a predetermined value.

A lower limit of the insulation resistance value may be not more than 50000 MΩ, and preferably, not more than 40000 MΩ. If the insulation resistance value exceeds 50000 MΩ, insulation may undesirably increases excessively. The insulation resistance value is obtained through measurement using an insulation resistance measurement apparatus such as, for example, "High Resistance Meter" manufactured by Agilent Technology Inc. described below.

A reason that the separation can be suppressed is considered as follows. If a predetermined driving voltage is repeatedly applied in a state where the piezoelectric vibrating plate 2 formed of piezoelectric ceramics is brought into contact with the liquid 10, the liquid 10 is positively charged. This is because piezoelectric ceramics have low insulation. Further, if such piezoelectric ceramics are driven as the piezoelectric vibrating plate 2, a potential difference between the internal electrode 3 and the liquid 10 occurs. Thus, the liquid 10 is positively charged.

If the liquid 10 is positively charged, a current flows in the piezoelectric vibrating plate 2 from the liquid 10 to the internal electrode 3 (a direction of the current is indicated by an arrow A). Then, it is considered that an electrolysis reaction occurs at a boundary of the piezoelectric vibrating plate and the internal electrode 3 and thus the internal electrode 3 and the piezoelectric vibrating plate 2 are separated from each other. The value of the current flowing between the liquid 10 and the ground electrode has been found to be not more than a specific value when the internal electrode 3 serves as a ground electrode, the rear surface of the piezoelectric vibrating plate 2 is brought into contact with the liquid 10, and a predetermined voltage is applied to the liquid 10. Accordingly, the separation can be suppressed.

Here, with regard to the contact of the piezoelectric vibrating plate 2 and the liquid 10, what is necessary is that the contact is made at such an area that the value of the current flowing between the liquid 10 and the ground electrode can be measured. Within this area range, the contact of the liquid 10 and the ground electrode may be made in a portion of the rear surface or the entire rear surface. Further, the liquid 10 is not particularly limited. Water, ink, liquid resin, or the like can be exemplified as the liquid 10. When the piezoelectric actuator 1 is applied to a liquid eject apparatus such as an ink jet recording head, ink is preferably used in this case. The ink, for example, aqueous dye ink, can be an aqueous pigment ink, ultraviolet curable UV ink, or the like.

(Piezoelectric Layer)

Ceramics having piezoelectricity (piezoelectric ceramics) can be used for the piezoelectric layer 4. Specifically, as examples, a Bi layered compound (layer perovskite compound), a tungsten-bronze compound, and a material containing perovskite compound such as Nb-based perovskite compound (an alkali niobate compound (NAC) and such as sodium niobate and alkali earth niobate compound (NAEC) such as barium niobate), lead magnesium niobate (PMN-based compound), lead nickel niobate (PNN-based compound), lead zirconate titanate (PZT) containing Pb and lead titanate can be used.

Among these piezoelectric ceramics, a perovskite compound containing at least Pb is preferably used. For example, a material containing lead magnesium niobate (PMN-based compound), lead nickel niobate (PNN-based compound), lead zirconate titanate (PZT) containing Pb, or lead titanate is preferably used. In particular, a crystal containing Pb as a constituent element at site A and containing Zr and Ti as constituent elements at site B is preferably used. With this composition, the piezoelectric layer having a high piezoelectric constant is obtained. Specifically, lead zirconate titanate containing Pb (PZT) or lead titanate is preferably used for achieving large displacement. As an example of the perovskite crystal, $PbZrTiO_3$ is preferably used.

Other oxides may be mixed to piezoelectric ceramics. In addition, other elements may be substituted as auxiliary components at site A and/or site B insofar as characteristics are not adversely affected. For example, a solid solution of $Pb(Zn_{1/3}Sb_{2/3})O_3$ and $Pb(Ni_{1/2}Te_{1/2})O_3$ that have Zn, Sb, Ni and Te added as auxiliary components is preferably used.

The thickness of the piezoelectric layer 4 may be approximately 5 to 50 μm, and preferably 10 to 30 μm. Accordingly, the displacement element 6 can exhibit high displacement. In contrast, if the thickness is smaller than 5 μm, mechanical strength may be lowered, and damages may occur during handling and operation. Further, if the thickness is larger than 50 μm, the displacement may be lowered.

(Piezoelectric Vibrating Plate)

The piezoelectric vibrating plate 2 is formed of piezoelectric ceramics. The piezoelectric vibrating plate 2 may be substantially formed of the same material as the piezoelectric layer 4. Accordingly, when the piezoelectric vibrating plate 2 and the piezoelectric layer 4 are fired simultaneously, firing contraction in the piezoelectric actuator 1 can be made uniform. Thus, curved deformation can be suppressed.

In addition, the piezoelectric vibrating plate 2 has high insulation such that the value of the current flowing between the liquid 10 and the ground electrode is preferably not more than a predetermined value. Specifically, the piezoelectric vibrating plate 2 preferably contains an insulator. The insulator may be exemplified by, for example, $ZrO_2$, $Al_2O_3$, MgO, $Mg_2Al_2O_5$, SiC, $Si_3N_4$, or the like.

The content of the insulator is determined such that a ratio is preferably achieved such that, when the voltage is applied to the liquid 10, the value of the current is not more than the predetermined value, and the insulation resistance value is not less than a predetermined value. Specifically, the content of the insulator may be 1% by weight, and preferably 20% by weight, with respect to the total weight of the piezoelectric vibrating plate. In addition, when the piezoelectric actuator 1 is applied to a liquid eject apparatus such as an ink jet recording head, a material having excellent resistance properties such as corrosion resistance against ink or water resistance is preferably used.

The thickness of the piezoelectric vibrating plate 2 may be 5 to 50 μm, and preferably 10 to 30 μm. Accordingly, the piezoelectric actuator 1 may be of a unimorph type. In contrast, if the thickness is smaller than 5 μm, when the voltage is applied to the liquid 10, the value of the current may exceed the predetermined value. On the other hand, if the thickness is larger than 50 μm, the displacement may be lowered.

(Internal Electrode)

For the internal electrode 3, it is not particularly limited insofar as that it has conductivity. For example, Au, Ag, Pd, Pt, Cu, Al, or an ally thereof can be exemplified. Specifically, for example, an Ag—Pd alloy can be used. Further, the thickness of the internal electrode 3 needs to be set such that the internal electrode 3 has conductivity but does not obstruct the displacement. In general, the thickness of the internal electrode 3 may be approximately 0.5 to 5 μm, and preferably 1 to 4 μm.

(Surface Electrode)

For the surface electrode 5, similar to the internal electrode 3, it is not particularly limited insofar as it has conductivity. For example, Au, Ag, Pd, Pt, Cu, Al, or an ally thereof can be used. Further, the thickness of the surface electrode 5 needs to be set such that it has conductivity and does not obstruct the displacement. For example, the thickness of the surface electrode 5 may be approximately 0.1 to 2 μm, preferably 0.1 to 0.5 μm, and more preferably 0.1 to 0.3 μm.

<Manufacturing Method>

Next, a manufacturing method of the piezoelectric actuator 1 described above will be described (First Process).

First, as a raw material of the piezoelectric layer 4 and the piezoelectric vibrating plate 2, a piezoelectric ceramics raw powder is prepared. A mean particle size of the piezoelectric ceramics raw powder is preferably not more than 1 μm, more preferably not more than 0.7 μm, and still more preferably not more than 0.6 μm. When the mean particle size of the piezoelectric ceramics raw powder is not more than 1 μm, upon sintering, uniform firing contraction is obtained. Thus, the piezoelectric layer 4 and piezoelectric vibrating plate 2 can be made uniform. The piezoelectric ceramics raw powder and an organic binder component are mixed so as to produce a sheet forming slurry. Subsequently, using the sheet forming slurry, a required number of green sheets are formed by a general sheet forming method, such as a roll coating method, a slit coating method or a doctor blade method.

When the voltage is applied to the liquid 10, the sheet forming slurry of the piezoelectric vibrating plate 2 preferably contains an insulator such that the value of the current flowing between the liquid 10 and the ground electrode is not more than the predetermined value. Specifically, the insulator may be mixed together with the piezoelectric ceramics raw powder and the organic binder component, thereby producing the sheet forming slurry. Further, the value of the current may be made to be not more than the predetermined value by adjusting the thickness of the ceramic green sheet that is subject to firing to form the piezoelectric vibrating plate 2. In this case, the thickness of the ceramic green sheet may be adjusted such that the thickness of the piezoelectric vibrating plate 2 is in a range of 5 to 50 μm, as described above.

The resultant ceramic green sheet is pressurized, if necessary. After the sheet formation, a pressurization processing of the ceramic green sheet is performed, thereby increasing a density of the sheet and reducing a variation in height or density. As a pressurization method, any known method can be used. For achieving a uniform height, a roll pressurization method, a planar pressurization method, a static pressure pressurization method or the like is preferably used. Further, a pressure upon pressurization varies by a material composition, the amount of an organic binder, the height of the green sheet, or the like. The pressurization may be performed at a pressure of generally 10 to 100 MPa, preferably 20 to 50 MPa, and more preferably 30 to 40 MPa. Further, if a variation in height of each green sheet obtained by pressurization is not more than 15%, and in particular, not more than 10%, a variation in height of the piezoelectric layer 4 and the piezoelectric vibrating plate 2 after firing is reduced, and curvative deformation can be prevented.

(Second Process)

Next, an internal electrode paste containing the above-described electrode material for the internal electrode is produced. In the internal electrode paste, in addition to the electrode material (Au, Ag, or the like), a component, for example, an organic vehicle or the like, such as ethyl cellulose, is contained. Then, among the produced ceramic green sheets, an electrode paste for the internal electrode 3 is printed on one surface of a green sheet, which is subject to firing to form the piezoelectric vibrating plate 2, by screen printing or the like. In this case, it is preferable to adjust the green sheet such that the thickness is 1 to 3 μm, and a variation (a difference between the maximum and the minimum) is 0.5 to 1 μm. Further, if necessary, a via hole may be formed in a portion of the green sheet, and a via conductor may be inserted therein.

(Third Process)

The ceramic green sheets produced in the first and second processes are laminated and closely adhered to each other, thereby producing a laminate. Moreover, a method that uses a close adhesion solution including a close adhesion component, a method that gives close adhesion to the organic binder in the green sheet by heating and performs close adhesion, a method that performs close adhesion only by pressurization or the like can be exemplified as a close adhesion method for the sheets.

(Fourth Process)

The laminate obtained in the third process is subject to a degreasing process as necessary, such that the organic component in the laminate is removed. Then, the laminate is fired at 900 to 1200° C. under an (high concentration) oxygen atmosphere, thereby obtaining a laminated sintered body. Moreover, in the fourth process (a firing process), it is preferable that a plurality of laminates obtained in the third process are stacked through a sample baseplate formed of zirconia or magnesia, and firing is performed by putting a weight on the stacked laminates. With this method, curvative deformation of the laminated sintered body can be suppressed, and a piezoelectric actuator formed of a thin sintered body having a thickness of not more than 100 μm can be provided.

(Fifth Process)

Next, a surface electrode paste containing the electrode material for the surface electrode is produced, and a surface electrode pattern is printed on a surface of the laminated sintered body obtained in the fourth process using the paste by screen printing or the like. A baking process may be performed at 500 to 800° C., and preferably at 650 to 800° C., thereby forming the surface electrode 5. Then, the piezoelectric layer 4 is polarized, thereby obtaining the piezoelectric actuator 1 as a laminated piezoelectric body.

<Inspection Method>

Next, an inspection method of a piezoelectric actuator according to an aspect of the invention will be described by way of the above-described piezoelectric actuator 1. As shown in FIG. 2, the inspection method measures the value of the current flowing between the liquid 10 and the ground electrode when the internal electrode 3 serves as the ground electrode, the rear surface of the piezoelectric vibrating plate 2 is brought into contact with the liquid 10, and the voltage is applied to the liquid 10. Accordingly, it is possible to determine that the piezoelectric actuator 1 has excellent driving durability.

Specifically, it is preferable that the voltage is a DC voltage of 0.5 to 60 V, and the value of the current be not more than 0.01 μA. When the voltage in the above range is applied in the piezoelectric actuator that has a current value of not more than 0.01 μA, even though a predetermined driving voltage is repeatedly applied in a state where the piezoelectric vibrating plate is brought into contact with the liquid, the internal electrode and the piezoelectric vibrating plate are rarely separated from each other. Thus, the piezoelectric actuator 1 has excellent driving durability. In contrast, in a piezoelectric actuator that has the current value exceeding 0.01 μA when the voltage is applied, driving durability is low. In such a manner, it is possible to determine that the piezoelectric actuator 1 has excellent driving durability.

The thickness of the piezoelectric actuator is preferably not more than 100 μm, at which point the separation drastically appears.

<Liquid Eject Apparatus>

Figure 3:
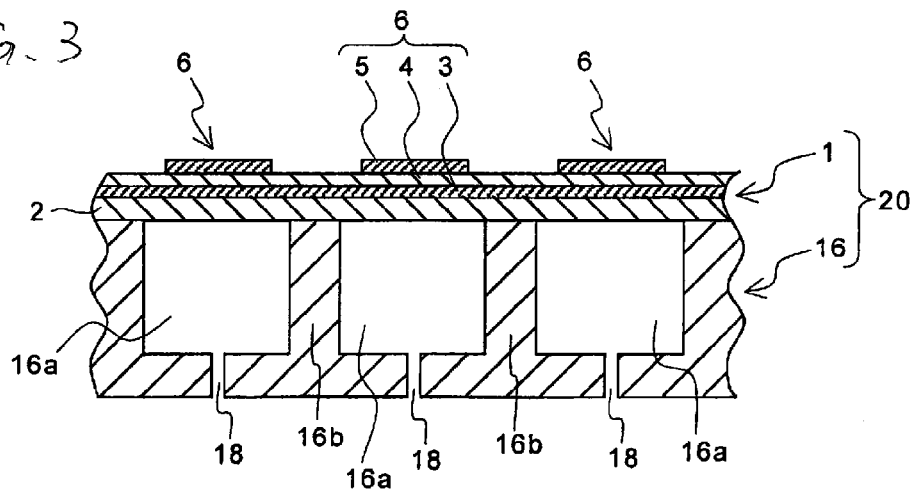
FIG. 3 is a schematic cross-sectional view showing a liquid eject apparatus.

Since the piezoelectric actuator according to the invention has a plurality of displacement elements on a substrate (piezoelectric vibrating plate), the piezoelectric actuator can be suitably used in a liquid eject apparatus such as an ink jet recording head. Hereinafter, an aspect of the liquid eject apparatus having the piezoelectric actuator according to the invention will be described. FIG. 3 is a schematic cross-sectional view showing a liquid eject apparatus. Moreover, in FIG. 3, the same parts as those in FIGS. 1 and 2 are represented by the same reference numerals, and the descriptions thereof will be omitted.

As shown in FIG. 3, in a liquid eject apparatus 20, a plurality of liquid flow passages 16a each having a liquid eject port 18 are provided in parallel, and the above-described piezoelectric actuator 1 is bonded on a flow passage member 16 forming partition walls 16b serving as walls partitioning the individual liquid flow passages 16a. In addition, the piezoelectric vibrating plate 2 forms a portion of each of the liquid flow passages 16a.

A common liquid supply flow passage (not shown) provided in the flow passage member 16 is connected to each of the liquid flow passages 16a formed in such a manner, and a liquid from the outside is supplied to and filled into each of the liquid flow passages 16a from the liquid supply flow passage. If the liquid is ejected, the ejected liquid flows into each of the flow passage 16a through the supply flow passage. Accordingly, the piezoelectric actuator 1 is mounted on the flow passage member 16 such that the rear surface of the piezoelectric vibrating plate 2 located above each of the liquid flow passages 16a is brought into contact with the liquid flow passage 16a.

The flow passage member 16 is obtained by a rolling method or the like. The liquid eject ports 18 and the liquid flow passages 16a are processed and provided to have predetermined shapes by etching or the like. The flow passage member 16 is preferably formed of at least one selected from a group of a Fe—Cr-based material, a Fe—Ni-based material and a WC—TiC-based material. In particular, the flow passage member 16 is preferably formed of a material having excellent corrosion resistance against ink. In this case, a Fe—Cr material is preferably used.

The flow passage member 16 and the piezoelectric actuator 1 are preferably laminated and adhered to each other, for example, through an adhesive layer such that the piezoelectric vibrating plate 2 is brought into contact with a space of the liquid flow passage 16a. Specifically, the flow passage member 16 and the piezoelectric vibrating plate 2 are adhered to each other such that the surface electrode 5 of each of the displacement elements 6 and each of the liquid flow passages 16a correspond to each other.

Various known materials can be used for the adhesive layer. For example, when heat does not have an effect on the piezoelectric actuator 1 or the flow passage member 16, at least one thermosetting resin-based adhesive selected from a group of epoxy resin, phenol resin and polyphenylene ether resin having a thermosetting temperature of 100 to 150° C. may be used. When heating is performed to the thermosetting temperature using such an adhesive layer, the piezoelectric actuator 1 and the flow passage member 16 can be heated and adhered to each other, thereby obtaining the liquid eject apparatus 20.

The driving voltage is applied to a certain surface electrode among the plurality of surface electrodes 5 in the piezoelectric actuator 1 so as to displace a certain displacement element 6. Then, the volume of the liquid flow passage 16a can be changed, and the liquid flowing in the liquid flow passage 16a can be ejected from the liquid eject port 18. As described above, since the piezoelectric actuator 1 has excellent driving durability, the liquid eject apparatus 20 including the piezoelectric actuator 1 also has excellent driving durability.

The liquid eject apparatus 20 having the above-described configuration can eject the liquid at high speed and with high precision, and can be suitably used as an ink jet recording head (printing head). That is, preferably, the liquid is ink, and the ink is ejected from the liquid eject port 18 so as to display a character or a picture on a surface of a member to be displayed (not shown) that is disposed to face the liquid eject port 18.

Although an aspect of the invention is described, the invention is not limited to the above-described aspect, various changes or modifications can be made within the scope without departing from the subject matter of the invention. For example, although a case where both the piezoelectric vibrating plate 2 and piezoelectric layer 4 are formed of a single layer has been described in the above-described aspect, the invention is not limited thereto. The piezoelectric vibrating plate and/or the piezoelectric layer may be formed of a plurality of layers. In this case, the thickness of the piezoelectric actuator can be simply adjusted.

As described above, the piezoelectric vibrating plate 2 and the piezoelectric layer 4 are preferably formed of substantially the same material. However, the compositions of the piezoelectric vibrating plate 2 and the piezoelectric layer 4 are not necessary consistent with each other. The compositions may be different insofar as the effects of the invention can be obtained, that is, the piezoelectric actuator having excellent driving durability can be obtained.

Hereinafter, aspects the invention will be described in detail by way of examples, but are not limited to the examples.

EXAMPLES

<Manufacture of Piezoelectric Actuator>

A piezoelectric actuator having the configuration shown in FIG. 1 is manufactured. Specifically, first, an organic binder component and an organic solvent are added to a piezoelectric ceramics powder (a $PbZrTiO_3$-based powder having a mean particle size of 0.5 μm) and mixed, thereby producing a sheet forming slurry. A green sheet for a piezoelectric layer is prepared to have a thickness of 40 μm using the slurry by a roll coating method.

Subsequently, a slurry is prepared in the same manner as the green sheet for a piezoelectric layer, except that an insulator ($ZrO_2$) is added to the piezoelectric ceramics powder in a ratio which results in obtaining a predetermined current value and insulation resistance value with respect to a predetermined applied voltage shown in each of Tables 1 to 3. Then, a green sheet for a piezoelectric vibrating plate is prepared using the slurry by a roll coating method such that the thickness after firing becomes a thickness shown in each of Tables 1 to 3.

In addition, an Ag—Pd powder is combined such that a mixture ratio of Ag:Pd is 7:3 as a mass ratio, and an organic bond and a solvent are mixed by a predetermined amount, thereby preparing an internal electrode paste. The internal electrode paste is coated on the green sheet for a piezoelectric vibrating plate, and the green sheet for a piezoelectric layer is then laminated on a surface on which the internal electrode paste is coated, and subsequently a laminate is formed through thermal pressing. The laminate is cut in a predetermined shape, and firing is performed at 1000° C. for two hours under an oxygen atmosphere, thereby preparing a laminated sintered body.

A surface electrode paste primarily containing Au is printed on a surface of the laminated sintered body facing the piezoelectric layer by screen printing, and baking is performed at 750° C., thereby forming a surface electrode. As a result, piezoelectric actuators are prepared (sample Nos. 1 to 12 in Tables 1 to 3).

Moreover, the thickness of each of the piezoelectric actuators is not more than 100 μm.

The current values and the insulation resistance values in Table 1 are measured by the following method as follows. The measurement results are also shown in Table 1.

(Measurement Method of Current Value and Insulation Resistance Value)

Each of the piezoelectric actuators is in a state shown in FIG. 2. That is, ink (aqueous dye ink) is used as the liquid. The internal electrode serves as the ground electrode. The rear surface of the piezoelectric vibrating plate is brought into contact with the liquid (ink). In this state, when each of predetermined applied voltages shown in Table 1 to 3 is applied to the liquid (ink), the value of the current flowing between the liquid (ink) and the ground electrode and the insulation resistance value are measured.

Here, as a measurement apparatus of the current value and the insulation resistance value, the "High Resistance Meter" manufactured by Agilent Technology Inc., that has both a function of measuring the current value and a function of the insulation resistance value when the predetermined voltage, is applied. Specifically, the predetermined voltage is applied to the liquid (ink) in a state where one of two terminals of the measurement apparatus is inserted into the liquid (ink) and the other terminal is brought into contact with a side surface of the piezoelectric vibrating plate. The current value and the insulation resistance value are measured from a potential difference between the terminals.

<Evaluation of Piezoelectric Actuator>

For the individual piezoelectric actuators obtained above, the presence/absence of the separation between the internal electrode and the piezoelectric vibrating plate is evaluated. The evaluation method is described below, and the results are shown in Tables 1 to 3.

(Evaluation Method)

The individual piezoelectric actuators are in a state as shown in FIG. 2. Ink (aqueous dye ink) is used as the liquid. The internal electrode serves as the ground electrode. The rear surface of the piezoelectric vibrating plate is brought into contact with the liquid (ink). In this state, when each of the applied voltages shown in Tables 1 to 3 is applied for 600 seconds, the presence/absence of the separation between the internal electrode and the piezoelectric vibrating plate is evaluated by the naked eye (a test where a direct current is continuously applied for 10 minutes). Moreover, an evaluation reference is set as follows.

Evaluation Reference

○: No Separation x: Separation

TABLE 1

| | | Sample No.[1] | | | | | |
|---|---|---|---|---|---|---|---|
| | | 1 | *2 | *3 | *4 | *5 | *6 |
| Thickness of Piezoelectric Vibrating Plate 10 μm | Applied Voltage (V) | 0.50 | 0.80 | 2.57 | 5.15 | 10.33 | 15.50 |
| | Current Value (μA) | 0.0001 | 0.0110 | 0.0338 | 0.0660 | 0.2583 | 0.1938 |
| | Insulation Resistance Value (MΩ) | 5000 | 73 | 76 | 78 | 40 | 80 |
| | Evaluation Result | ○ | x | x | x | x | x |

[1] "*" means a sample out of the range of the invention.

TABLE 2

| | | Sample No.[1] 7 |
|---|---|---|
| Thickness of Piezoelectric Vibrating Plate 14 μm | Applied Voltage (V) | 20.58 |
| | Current Value (μA) | 0.0011 |
| | Insulation Resistance Value (MΩ) | 18000 |
| | Evaluation Result | ○ |

TABLE 3

| | | Sample No.[1] | | | | |
|---|---|---|---|---|---|---|
| | | 8 | 9 | 10 | *11 | *12 |
| Thickness of Piezoelectric Vibrating Plate 20 μm | Applied Voltage (V) | 4.90 | 29.73 | 57.81 | 69.93 | 77.08 |
| | Current Value (μA) | 0.0001 | 0.0042 | 0.0044 | 0.8227 | 0.5929 |
| | Insulation Resistance Value (MΩ) | 34700 | 7000 | 13000 | 85 | 130 |
| | Evaluation Result | ○ | ○ | ○ | x | x |

[1] "*" means a sample out of the range of the invention.

Figure 4:
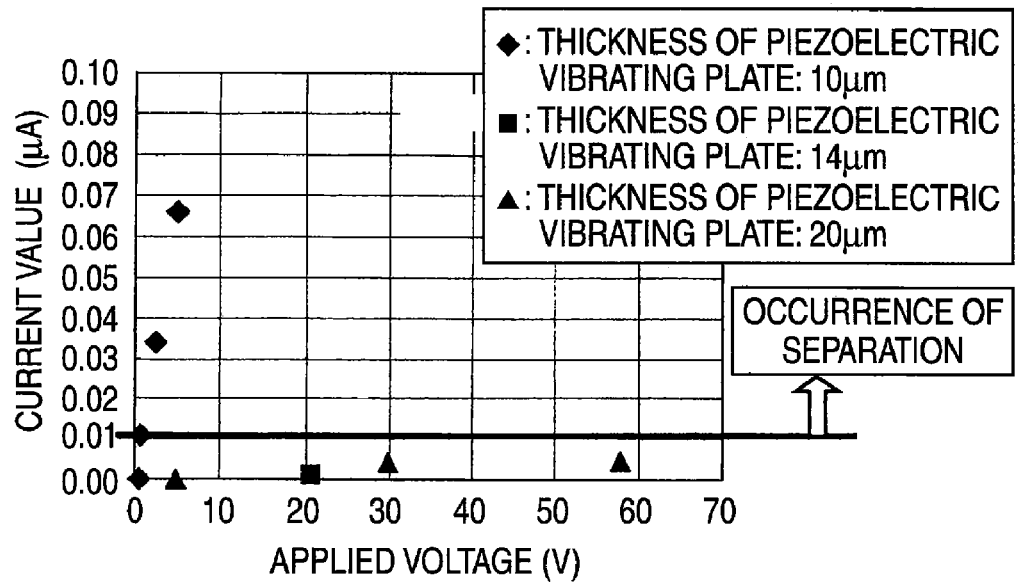
FIG. 4 is a graph showing the relationship between a current value and an applied voltage in an aspect of the invention.
Figure 5:
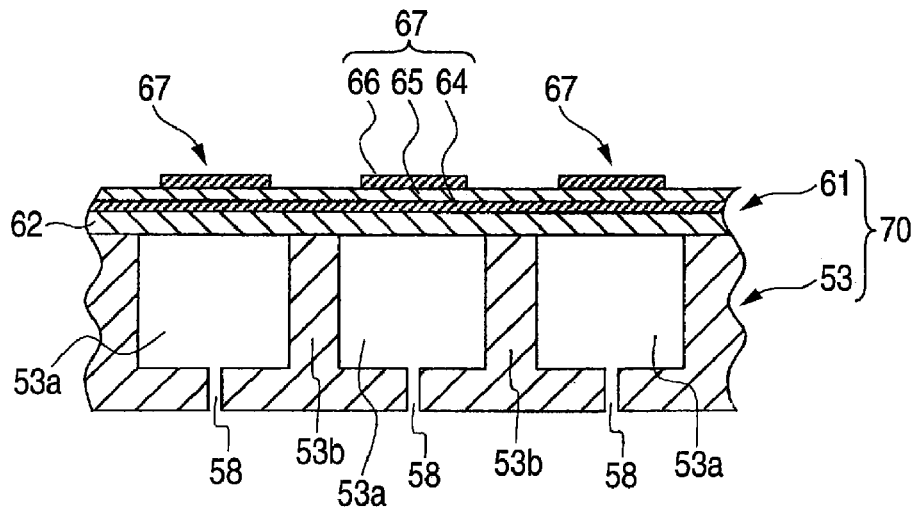
FIG. 5 is a schematic cross-sectional view showing a known liquid eject apparatus.

The relationship between the current value and the applied voltage is shown in FIG. 4. As will be apparent from Tables 1 to 3 and FIG. 4, in the sample Nos. 1, and 7 to 10 within the range of the invention, it can be seen that, even though a predetermined driving voltage is repeatedly applied in a state where the piezoelectric vibrating plate is brought into contact with the liquid (ink), the separation between the internal electrode and the piezoelectric vibrating plate can be suppressed. In contrast, in the sample Nos. 2 to 6, 11, and 12 out of the range of the invention, the separation between the internal electrode and the piezoelectric vibrating plate occurs.

According to the aspects of the invention, when the internal electrode serves as a ground electrode, a rear surface of the piezoelectric vibrating plate formed of piezoelectric ceramics is brought into contact with a liquid, and a predetermined voltage is applied to the liquid, a value of a current flowing between the liquid and the ground electrode is thus controlled to be not more than a specific value. Accordingly, the internal electrode and the piezoelectric vibrating plate can be suppressed from being separated from each other by repeatedly applying a predetermined driving voltage for a long time in a state where the piezoelectric vibrating plate is brought into contact with the liquid. Therefore, a piezoelectric actuator having excellent driving durability can be obtained. Further, it is possible to determine that a piezoelectric actuator has excellent driving durability.

According to another aspect of the invention, the predetermined voltage is in a range of 0.5 to 60V. According to still another aspect of the invention, the piezoelectric actuator has a thickness of not more than 100 μm. According to still another aspect of the invention, the liquid is an ink. According to still another aspect of the invention, the thickness of the piezoelectric vibrating plate is in a range of 5 to 50 μm. According to still another aspect of the invention, the piezoelectric vibrating plate includes an insulator. According to still another aspect of the invention, the insulator is a material selected from a group consisting of $ZrO_2$, $Al_2O_3$, MgO, $Mg_2Al_2O_5$, SiC and $Si_3N_4$. According to still another aspect of the invention, an insulation resistance value between the liquid and the internal electrode is not less than 100 MΩ.

According to still another aspect of the invention, in the inspection method of a piezoelectric actuator, the predetermined voltage is in a range of 0.5 to 60 V, and the value of the current is not more than 0.01 μA. According to still another aspect of the invention, the predetermined voltage is a DC voltage.

According to still another aspect of the invention, in the liquid eject apparatus, the predetermined voltage is in a range of 0.5 to 60V. According to still another aspect of the invention, the liquid is an ink, and the ink is ejected from the liquid eject port so as to display a character or a picture on a surface of a member to be displayed, the member being disposed to face the liquid eject port.

What is claimed is:

1. A piezoelectric actuator comprising:
   a piezoelectric vibrating plate including piezoelectric ceramics;
   an internal electrode formed on a first surface of the piezoelectric vibrating plate;
   a piezoelectric layer formed on the internal electrode; and
   a plurality of surface electrodes that are provided on a surface of the piezoelectric layer, wherein the piezoelectric vibrating plate has a characteristic which, when the internal electrode is grounded and a predetermined voltage between 0.5V and 60V is applied to a liquid contacting with a second surface of the piezoelectric vibrating plate, prevents a value of a current flowing between the liquid and the internal electrode from exceeding 0.01 μA.

2. The piezoelectric actuator according to claim 1, wherein an insulation resistance value between the liquid and the internal electrode is not less than 100 M□.

3. The piezoelectric actuator according to claim 1, wherein the piezoelectric actuator has a thickness of not more than 100 μm.

4. The piezoelectric actuator according to claim 1, wherein the liquid is an ink.

5. The piezoelectric actuator according to claim 1, wherein the thickness of the piezoelectric vibrating plate is in a range of 5 to 50 μm.

6. The piezoelectric actuator according to claim 1, wherein the piezoelectric vibrating plate includes an insulator.

7. The piezoelectric actuator according to claim 5, wherein the insulator is a material selected from a group consisting of $ZrO_2$, $Al_{2O3}$, MgO, $Mg_2Al_2O_5$, SiC and $Si_3N_4$.

8. An inspection method of a piezoelectric actuator, the piezoelectric actuator including
   a piezoelectric vibrating plate including piezoelectric ceramics,
   an internal electrode formed on a first surface of the piezoelectric vibrating plate,
   a piezoelectric layer formed on the internal electrode, and
   a plurality of surface electrodes that are provided on a surface of the piezoelectric layer, the method comprising:
   preparing the piezoelectric actuator;
   grounding the internal electrode and contacting a liquid with a second surface of the piezoelectric vibrating plate;
   applying a predetermined voltage to the liquid; and
   measuring a value of a current flowing between the liquid and the internal electrode.

9. The inspection method of a piezoelectric actuator according to claim 8, wherein the predetermined voltage is in a range of 0.5 to 60 V, and the value of the current is not more than 0.01 μA.

10. The inspection method of piezoelectric actuator according to claim 9, wherein the predetermined voltage is a DC voltage.

* * * * *